United States Patent [19]

Kyogoku

[11] Patent Number: 5,571,330
[45] Date of Patent: Nov. 5, 1996

[54] LOAD LOCK CHAMBER FOR VERTICAL TYPE HEAT TREATMENT APPARATUS

[75] Inventor: Mitsusuke Kyogoku, Tama, Japan

[73] Assignee: ASM Japan K.K., Tokyo, Japan

[21] Appl. No.: 256,504

[22] PCT Filed: Nov. 12, 1993

[86] PCT No.: PCT/JP93/01660

§ 371 Date: Sep. 19, 1994

§ 102(e) Date: Sep. 19, 1994

[87] PCT Pub. No.: WO94/11898

PCT Pub. Date: May 26, 1994

[30] Foreign Application Priority Data

Nov. 13, 1992 [JP] Japan .................. 4-327614

[51] Int. Cl.[6] .................................................. C23C 16/00
[52] U.S. Cl. .................. 118/719; 118/715; 118/724; 118/725; 414/217; 414/939
[58] Field of Search .................. 118/715, 724, 118/725, 719; 432/241; 414/156, 198, 217, 939, 940

[56] References Cited

U.S. PATENT DOCUMENTS

| 4,962,726 | 10/1990 | Matsushita | 118/719 |
| 5,088,444 | 2/1992 | Ohmine | 118/719 |
| 5,127,365 | 7/1992 | Koyama | 118/724 |
| 5,156,521 | 10/1992 | Crabb | 414/786 |
| 5,224,999 | 7/1993 | Shiraiwa | 118/724 |
| 5,232,508 | 8/1993 | Arena | 118/719 |
| 5,260,547 | 11/1993 | Houzay | 219/390 |
| 5,433,784 | 7/1995 | Miyagi | 118/715 |
| 5,462,397 | 10/1995 | Iwabuchi | 414/222 |

FOREIGN PATENT DOCUMENTS

| 62-113420 | 5/1987 | Japan . | |
| 62-290126 | 12/1987 | Japan . | |
| 63-128711 | 6/1988 | Japan . | |
| 1-7517 | 1/1989 | Japan . | |
| 1-68920 | 3/1989 | Japan . | |
| 306824 | 10/1992 | Japan | 118/724 |
| 5-206043 | 8/1993 | Japan . | |
| 6-53302 | 2/1994 | Japan | 414/217 |
| 6-120159 | 7/1994 | Japan . | |

*Primary Examiner*—Robert Kunemund
*Assistant Examiner*—Jeffrie R. Lund
*Attorney, Agent, or Firm*—Knobbe, Martens, Olson & Bear

[57] ABSTRACT

The present invention is a load lock chamber for a vertical type heat treatment apparatus which has no elevating device which requires the provision of lubricating oil which is a source of particles causing contamination in the chamber. Below a treatment chamber, an intermediate chamber is arranged. A support stand is provided below a boat table for supporting the objects to be processed, which can be loaded into or unloaded from the treatment chamber gastightly through the intermediate chamber. This support stand is mounted on a member movable vertically by means of a feed screw. A bellows is mounted between the intermediate chamber and the movable member.

2 Claims, 6 Drawing Sheets

PRIOR ART

PRIOR ART

LOAD LOCK CHAMBER FOR VERTICAL TYPE HEAT TREATMENT APPARATUS

TECHNICAL FIELD

The present invention relates generally to a load locked vertical type heat treatment apparatus, and, more specifically, to a load lock chamber for a load locked vertical type heat treatment apparatus.

BACKGROUND ART

FIGS. 3A and 3B show a cross-sectional view of a load locked vertical type heat treatment apparatus. As shown in FIGS. 3A and 3B, the load locked vertical type heat treatment apparatus is comprised of a treatment chamber 1 and an elevator chamber 11.

A reaction tube 2 is provided in the treatment chamber 1, and a compartment tube 3 is provided in the reaction tube 2. A manifold 4 is arranged below the treatment chamber 1 and has a gas inlet 9 for introducing a gas therein and a gas outlet 10 for exhausting the gas therefrom. A heater is positioned around the reaction tube 2 so that the reaction tube 2, objects 7 inside the reaction tube and the like can be heated.

A boat 5 for carrying a plurality of objects 7, such as semiconductor wafers, and a boat table 6 for supporting the boat 5 thereon can be moved in and out from the compartment tube 3 through the manifold 4. The objects 7 are carried by the boat 5 at vertical intervals. A treatment to be performed of the objects 7 may be to form a thin film by a chemical vapor deposition, annealing or the like.

The elevator chamber 11 is connected below the treatment chamber 1 through the manifold 4. The elevator chamber 11 is communicated with the treatment chamber 1 through an opening 11a provided at the top of the elevator chamber 11 and an opening 4a of the manifold 4 which has a diameter smaller than the opening 11a (see FIG. 3B). In the elevator chamber 11, untreated objects are placed on the boat 5, or treated objects are removed from the boat 5.

A sealing flange 8 having an outer diameter larger than the opening 4a and an inner diameter smaller than the opening 11a is mounted on the bottom surface of the boat table 6. The sealing flange 8 contacts a shoulder formed between the opening 4a and the opening 11a to open and close an interior space of the treatment chamber 1. By such opening and closing, the treatment chamber 1 is completely separated from an interior space of the elevator chamber 11.

The sealing flange 8 is mounted on one end of a movable member 12 which extends horizontally and has a hole provided at the other end. A feed screw 13 is screwed into the hole and extends upwardly and downwardly therethrough. The upper end of the feed screw 13 is rotatably mounted to an upper wall of the elevator chamber 11. The lower end of the screw 13 extends outside the elevator chamber 11 and passes through the bottom of the elevator chamber 11 via an O-ring (not shown) by which the interior of the elevator chamber 11 is maintained in vacuum.

A pulley 15b is mounted about the lower end of the feed screw 13 extending exterior to the elevator chamber 11. The pulley 15b is connected to a pulley 15a connected by a belt 16 to an end of a motor 14 provided exterior to a side wall of the elevator chamber 11. Thus, by driving the motor 14, rotation is transferred to the feed screw 13, and the movable member 12 travels upwardly and downwardly. Accordingly, the boat table 6 with the boat 5 mounted thereon is moved from the interior of the elevator chamber 11 into the treatment chamber 1, and vice versa. Whenever it is necessary to exhaust gas or vapor from the elevator chamber 11, the exhausting can be done through an outlet 17.

FIG. 3B shows the boat table 6 descended until the objects 7 are completely contained inside the elevator chamber 11. When placing objects 7 on the boat 5, the boat table 6 is descended into the elevator chamber 11 as shown in FIG. 3B and untreated objects are supplied to the boat 5 through an opening 20 and a gate valve 18. After treatment, in a similar manners the boat 5 is descended and treated objects are removed from the boat 5 and returned to a room 19.

However, in a load locked vertical type heat treatment apparatus of the art, means for elevating the boat table 6, that is the movable member 12, and the feed screw 13 are provided in the elevator chamber 11. Thus, particles or debris caused by rotating the feed screw 13 and screwing the feed screw 13 into the movable member 12 are present in the chamber 11.

Also, when evacuating the interior of the elevator chamber 11 and elevating the boat table 6, lubricating oil is required for the engaging section between the feed screw 13 and the boat table 6 in order to make the elevating motion smooth. The lubricating oil typically has a low vapor pressure, and when structures inside the elevator chamber 11 are heated by radiation from the heated objects 7 when the objects 7 are unloaded from the treatment chamber 1 after treatment, the lubricating oil is evaporated in the elevator chamber 11, thereby contaminating the objects 7.

Moreover, in a vacuum load locked apparatus, because an interior of a chamber is always in a state of vacuum, it is very difficult to provide a mechanism for rotating a boat table for supporting objects.

Accordingly, an objective of the present invention is to provide a load lock chamber for a vertical type heat treatment apparatus which has no elevating device requiring the provision of lubricating oil which is a source of particles causing contamination in the elevator chamber.

Another objective of the present invention is to provide a load lock chamber for a vertical type heat treatment apparatus which can rotate a boat table supporting objects from the exterior.

DISCLOSURE OF THE INVENTION

In order to accomplish the above objectives, a load lock chamber for a vertical type heat treatment apparatus of the present invention is provided which can be freely expanded in the vertical direction, is arranged below a treatment chamber of the vertical type heat treatment apparatus, and can gastightly load a supporting means for placing objects into the apparatus and unload the supporting means from the apparatus through a lower part of the apparatus. The load lock chamber is vertically expanded by elevating means provided outside the load lock chamber. The supporting means is mounted in the load lock chamber.

The load lock chamber may be comprised of two chamber sections such as an upper and a lower chamber section, of differing sizes, and which are connected in vertical. The two chamber sections are preferably telescopically connected or nested therebetween.

The load lock chamber preferably comprises a metal bellows, and elevating means are preferably comprised of a feed screw. A movable member connected to a feed screw extends vertically and is engaged with a bottom of the load lock chamber. If two bellows are used, connecting means therebetween are preferably provided. In addition, the load lock chamber preferably comprises means for rotating the feed screw.

A vertical type heat treatment apparatus of the present invention vertically contracts by elevating means provided externally thereof, and, according to the contraction, objects supported by a supporting body are loaded into a treatment chamber, and then transferred therefrom. An outside of a bottom of the supporting body can be under atmospheric conditions, so that means for rotating the supporting body can be accessed from the exterior.

The elevating means are provided outside the load lock chamber, so that particles caused by the elevation and the like do not penetrate into the chamber.

PREFERRED EMBODIMENT FOR CARRYING OUT THE INVENTION

Figure 1A:
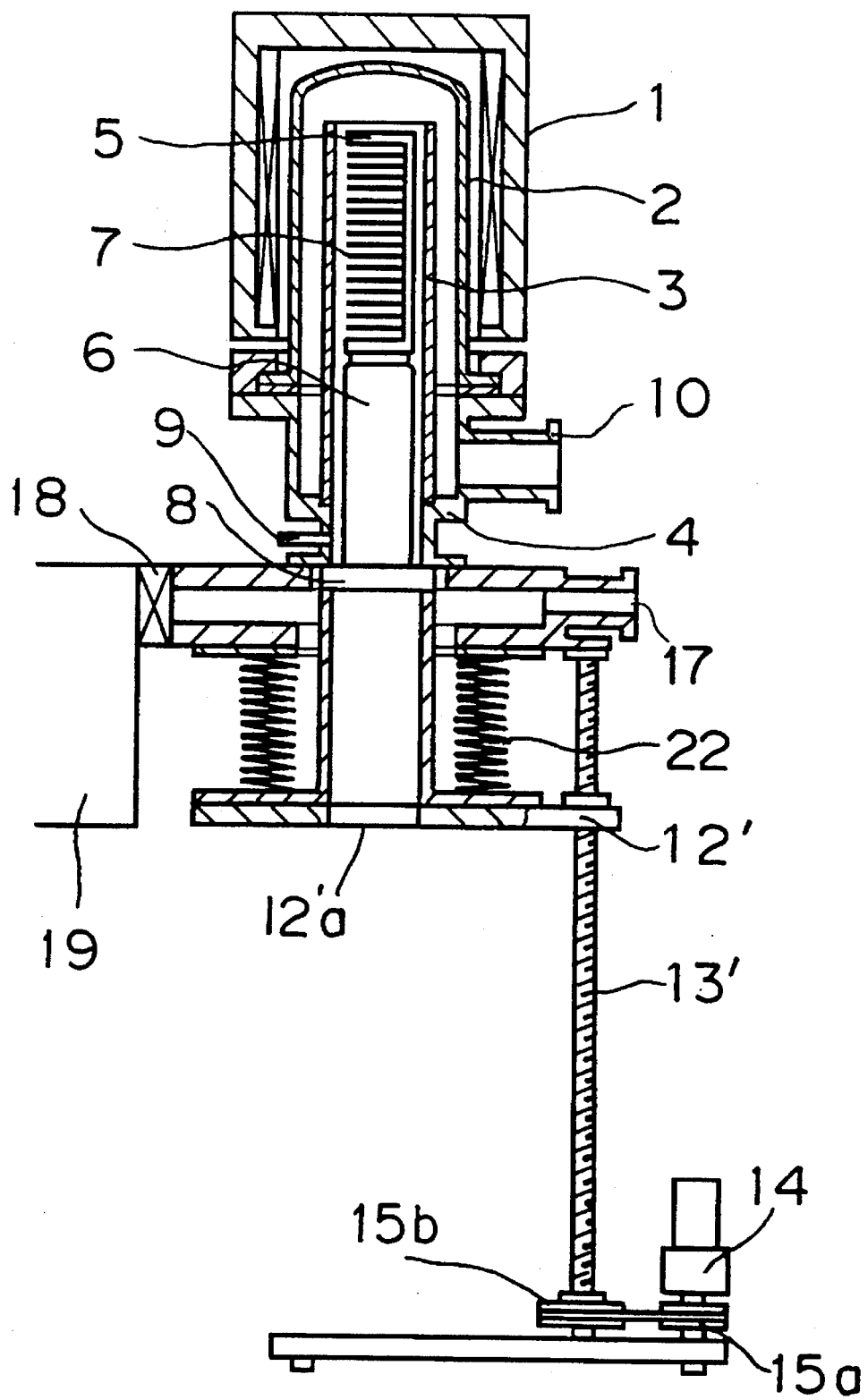
FIG. 1A shows a partial cross-sectional view of a load lock chamber for a vertical type heat treatment apparatus in accordance with one embodiment of the present invention, in which a boat table has been elevated upwardly to its upper position.
Figure 1B:
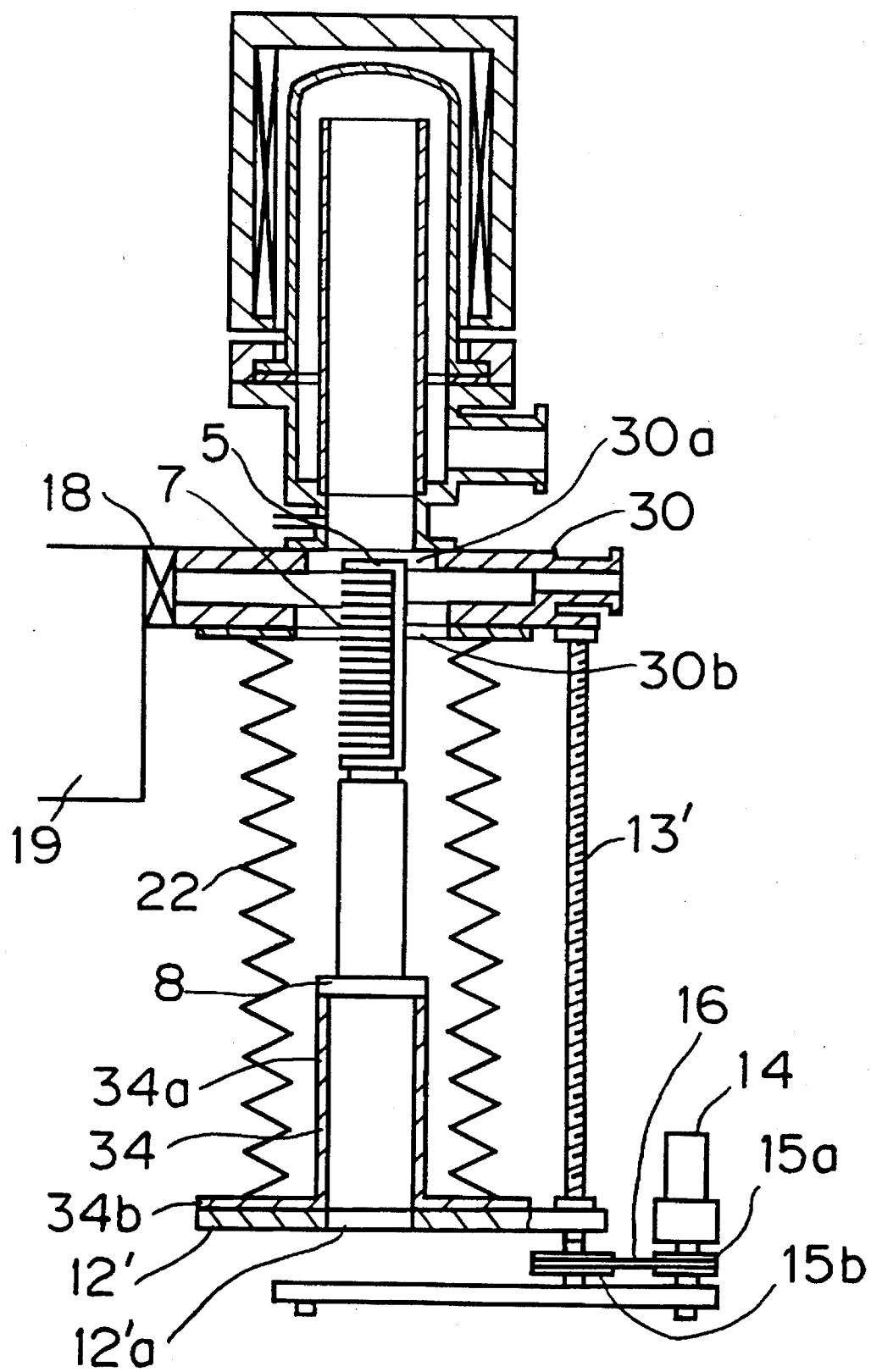
FIG. 1B shows a partial cross-sectional view of the load lock chamber of FIG. 1A with the boat table elevated downwardly to its lower position.

FIGS. 1A and 1B show a partial cross-sectional view of a load lock chamber for a vertical type heat treatment apparatus in accordance with the present invention, wherein FIG. 1A shows a state with the load lock chamber contracted and FIG. 1B shows a state with the load lock chamber extended.

Figure 2A:
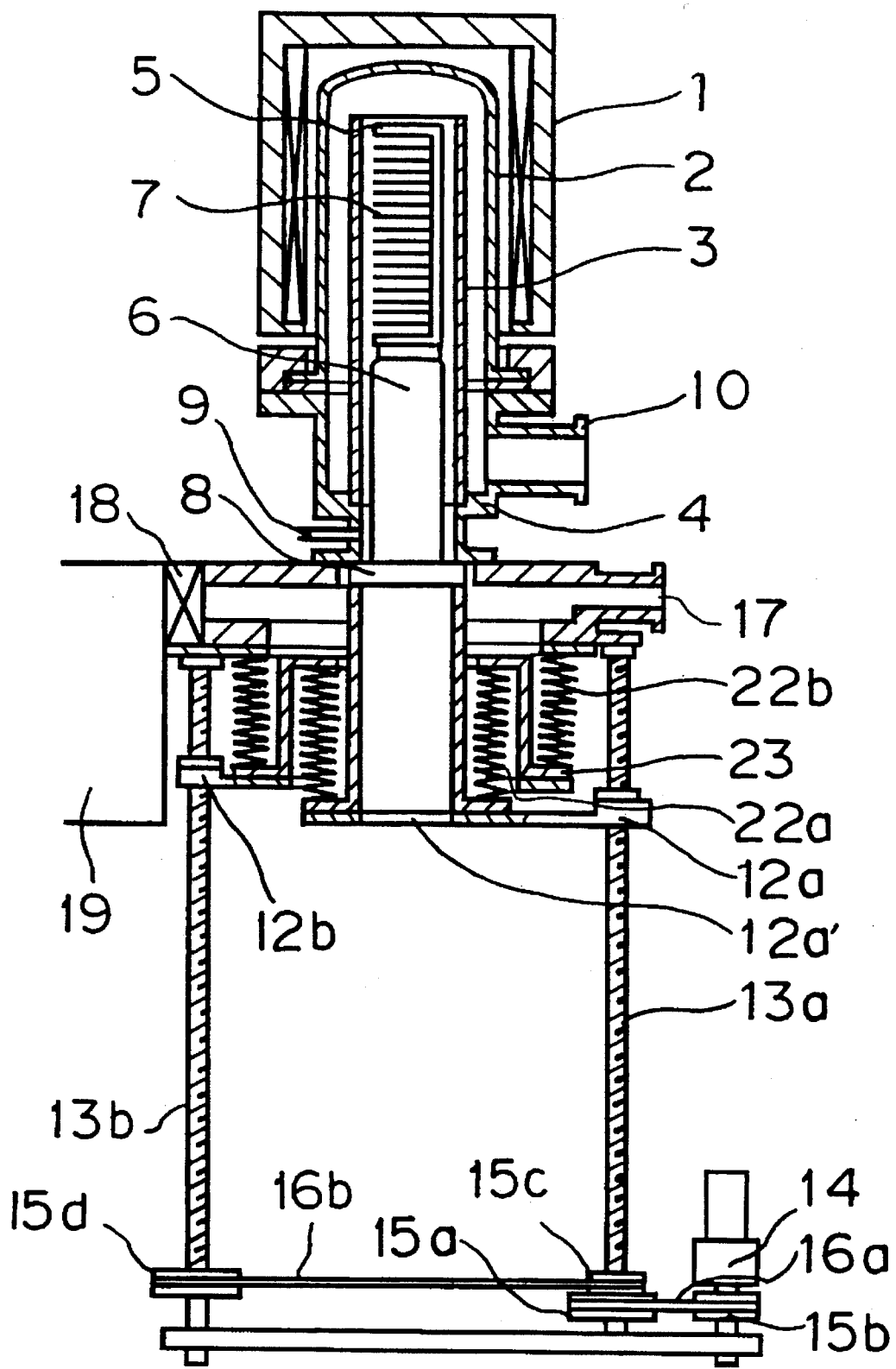
FIG. 2A shows a partial cross-sectional view of another embodiment of a load lock chamber for a vertical type heat treatment apparatus in accordance with the present invention, in which a boat table has been elevated upwardly to its upper position.
Figure 2B:
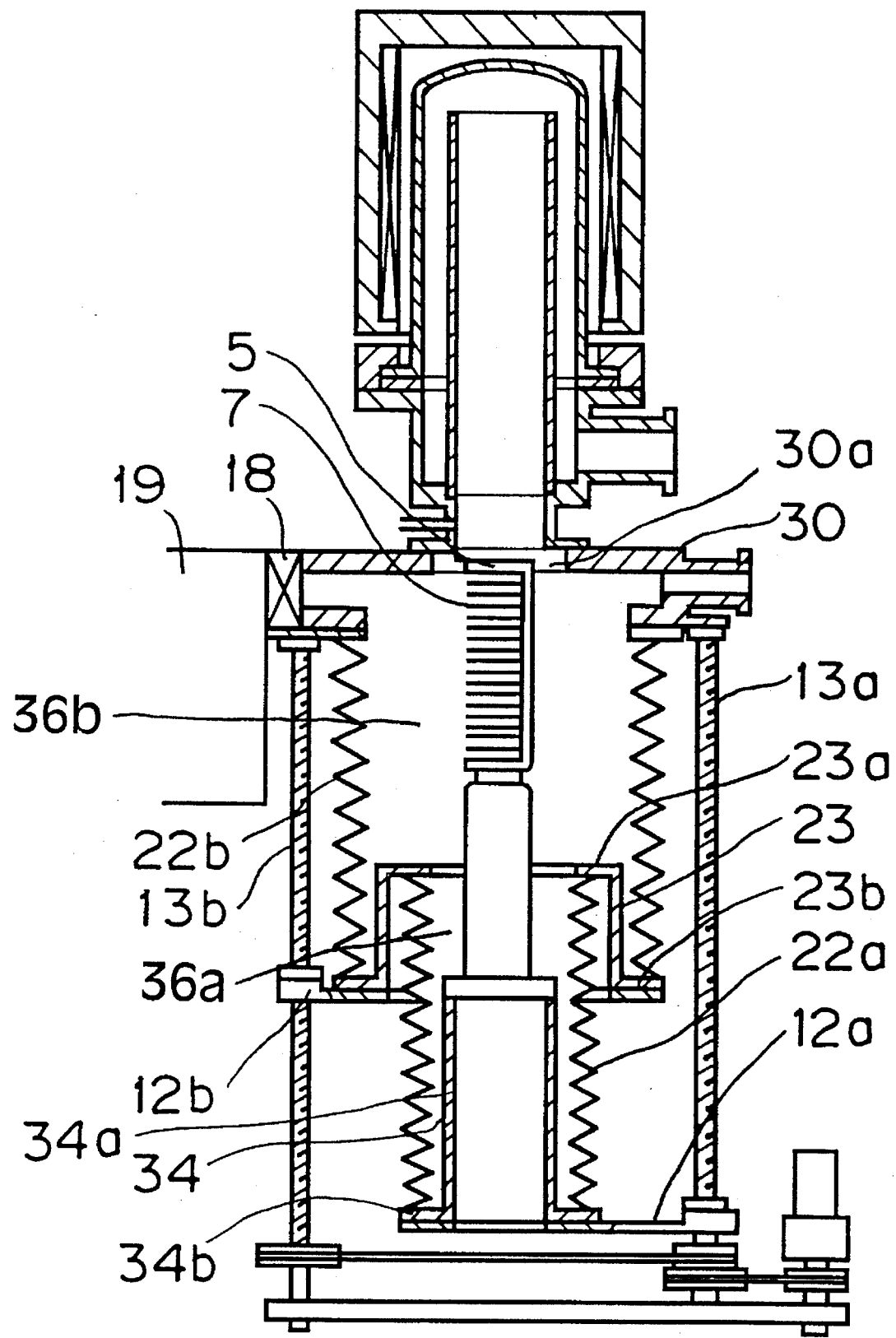
FIG. 2B shows the load lock chamber of FIG. 2A with the boat table elevated downwardly to its lower position.
Figure 3A:
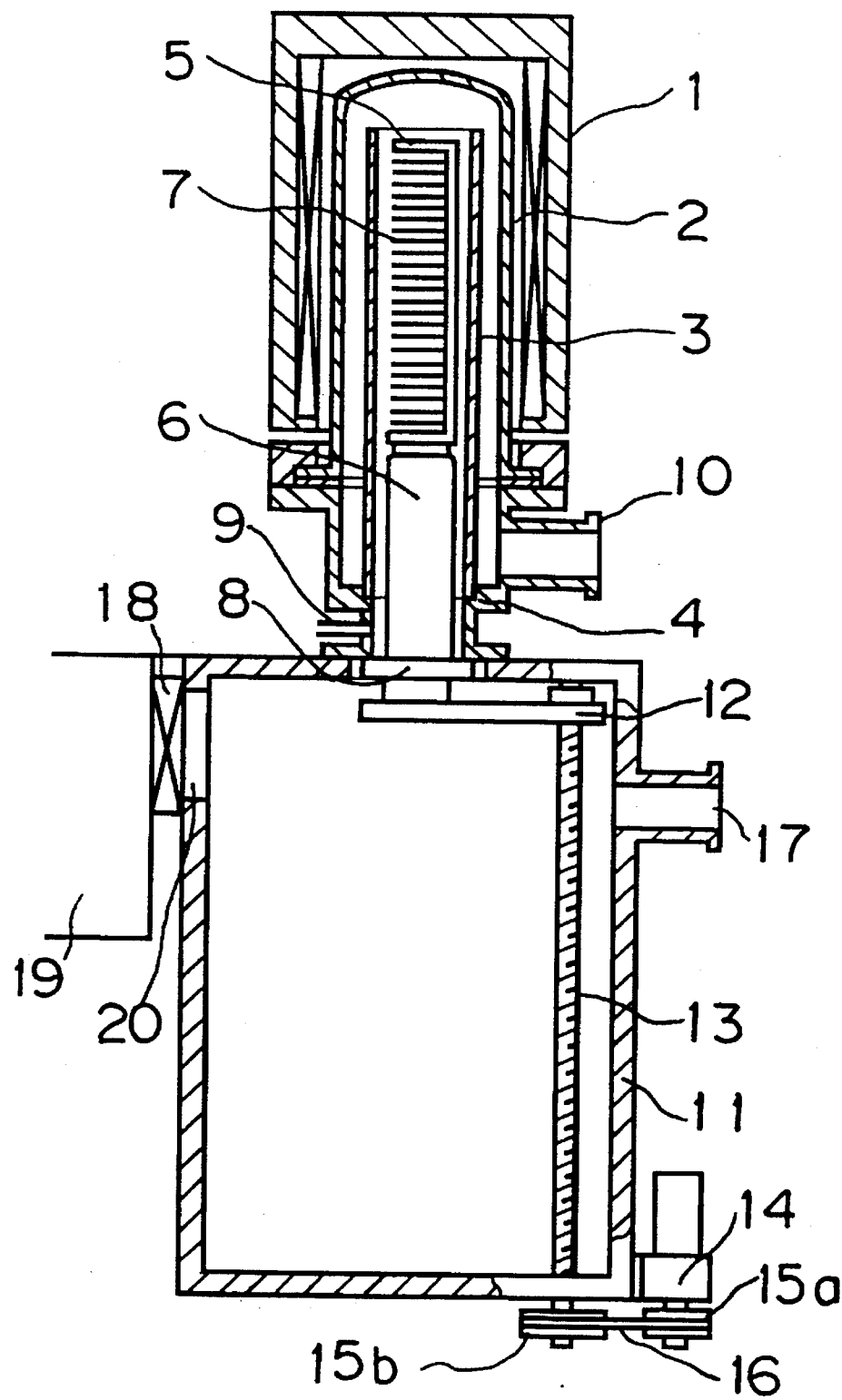
FIG. 3A shows a cross-sectional view of a load lock chamber for a vertical type heat treatment apparatus in accordance with the art, in which a boat table has been elevated upwardly to its upper position.
Figure 3B:
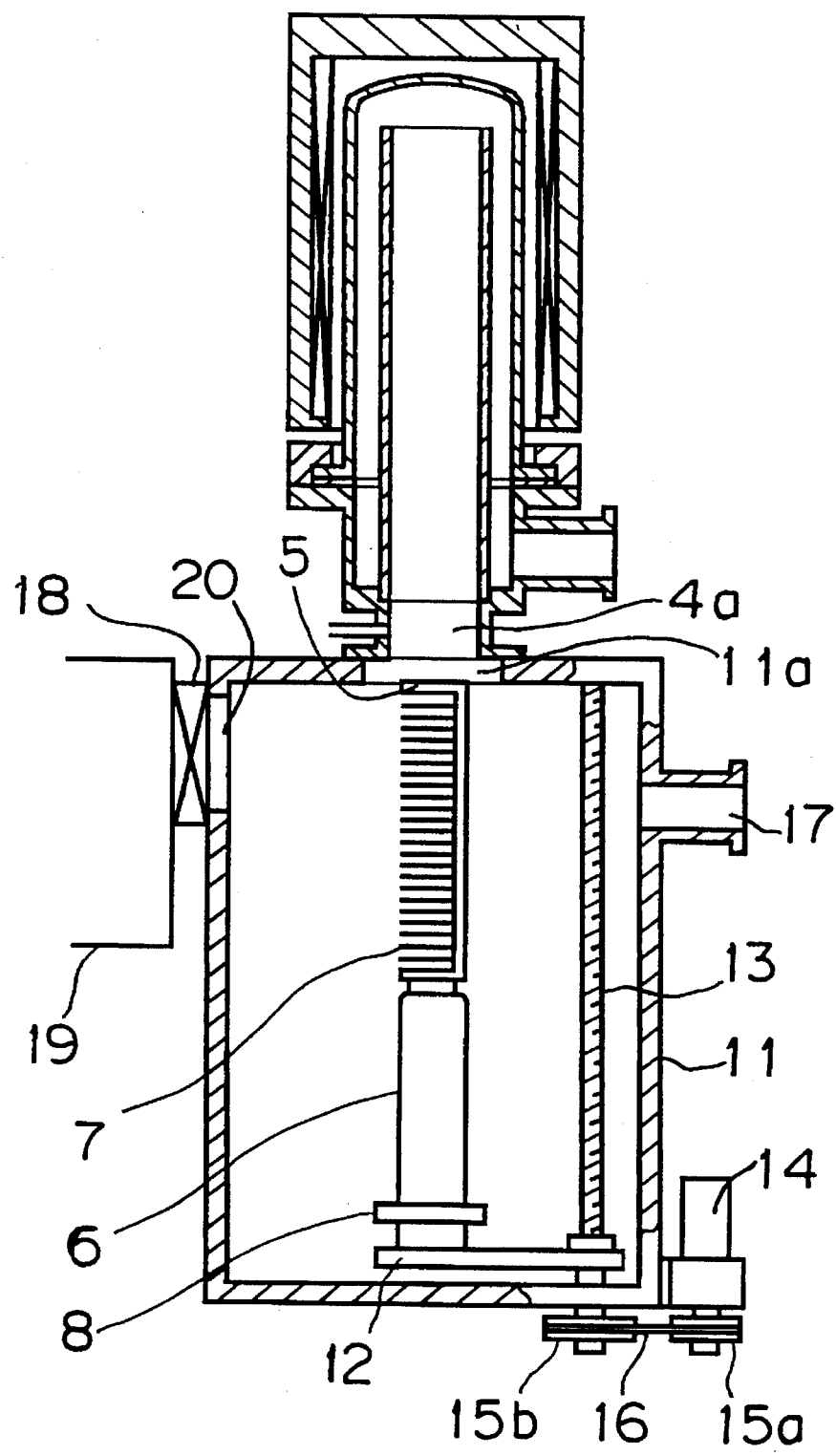
FIG. 3B shows the load lock chamber of FIG. 3A with the boat table elevated downwardly to its lower position.

The same reference numbers are utilized with respect to FIGS. 1A, 1B, 2A and 2B for the load lock chamber for a vertical type heat treatment apparatus of the present invention as were used to show and describe the load lock chamber for a vertical type heat treatment chamber of FIGS. 3A and 3B when common structural elements are referenced herein.

In the apparatus shown in FIGS. 1A and 1B, an intermediate chamber 30 is mounted below a manifold 4, and the intermediate chamber 30 communicates with a treatment chamber 1 through an opening 30a having a diameter larger than a sealing flange 8. Also, the intermediate chamber 30 has an outlet 17 and a room 19 for supplying and removing objects via a gate valve 18, similar to FIGS. 3A and 3B. Moreover, an opening 30b having a diameter almost the same size as the opening 30a is provided in the intermediate chamber 30.

A support stand 34 comprises a cylindrical section 34a having a diameter about the same size as the sealing flange 8. The support stand 34 further comprises a flange 34b provided on a lower end thereof and extended outwardly. The support stand 34 is mounted below the sealing flange 8 and communicates therewith through the opening 30b. The flange 34b is fixed on a movable member 12' and a metallic bellows 22 is mounted gastightly between the flange 34b and the bottom of the intermediate chamber 30 so that the load lock chamber is formed, and a boat table 6 and a support boat 5 are isolated from the exterior.

A central opening 12'a which has about the same size diameter as the inner diameter of the cylindrical section 34a is provided in the movable member 12', and the lower surface of the sealing flange 8 is thereby exposed to the exterior. Therefore, a mechanism for rotation can be installed through the sealing flange 8 from the exterior. For example, by gastight communication of a rotational shaft of a motor for the rotational mechanism with the lower part of the sealing flange 8, and by directly connecting the rotational shaft to the boat table 6 positioned above the sealing flange 8, the boat table 6 can be directly rotated externally.

A threaded hole is formed at an end of the movable member 12', and a feed screw 13' is screwed into the hole outside the bellows 22. The screw 13' extends vertically through the hole and when the screw 13' is rotated the member 12' is moved vertically.

A rotation provided by a motor 14 is transferred to the feed screw 13' by a belt 16 connecting a pulley 15b, which is connected to the lower end of the feed screw 13', and a pulley 15a, which is connected to the motor 14. When the movable member 12' and boat table 6 are elevated by rotating the feed screw 13', the bellows 22 expands correspondingly so that the interior of the load lock chamber can be maintained in a gastight seal.

FIG. 1B shows a state of the load lock chamber when the movable member 12' has been moved to the lowest position. In this position, objects 7 can be placed onto or removed from the objects supporting boat 5.

FIGS. 2A and 2B show another embodiment of the present invention. This embodiment differs from the embodiment shown in FIGS. 1A and 1B in that two bellows are utilized. Similar to the apparatus of FIGS. 1A and 1B, a support stand 34 comprising a cylindrical section 34a and a flange 34b is provided below a sealing flange 8. The flange 34b is mounted on a first movable member 12a having an opening 12a'. The first movable member 12a can be elevated by rotating a first feed screw 13a, similar to the movable member 12' and feed screw 13' in FIGS. 1A and 1B.

A first bellows 22a, which has a lower end gastightly mounted on the flange 34b, is arranged around the cylindrical section 34a of the support stand 34. A cylindrical connecting means is positioned outside the bellows 22a, and the upper end of the first bellows 22a is gastightly mounted to the bottom or underside of a first flange 23a which extends radially inward at the upper end of the connecting means 23.

The lower end of the connecting means 23 has a flange 23b extending radially outward, and the flange 23b has a hole to secure a second feed screw 13b similar to the first feed screw 13a. The flange 23b is gastightly mounted on a second movable member 12b which is elevated by rotating the second feed screw 13b. The second movable member 12b also has a central opening section capable of communicating the first bellows 22a therethrough.

A second bellows 22b, having a diameter larger than the first bellows 22a and the connecting means 23, is gastightly mounted between a lower end of an intermediate chamber 30 and the flange 23b of the connecting means 23, thereby surrounding the connecting means 23. Therefore, as shown in FIG. 2B, the load lock chamber of the present invention includes a lower chamber portion 36a generally formed by the first bellows 22a and an upper chamber portion 36b generally formed by the second bellows 22b. As described above, by nesting two bellows 22a, 22b having lengths which are almost the same, the length of each bellows can be reduced. Also, comparing with the bellows 22 of the embodiment of FIGS. 1A and 1B, the amount of expansion of each bellows is small, and the life of the bellows can be extended thereby.

As an alternative of this nested embodiment, the diameter of the first bellows 22a may be larger and the diameter of the second bellows 22b may be smaller. Also, although the whole, overall length is longer, the diameters of two bellows may be set equal, and they may be connected by other connecting means.

Accordingly, the load lock chamber is formed by the first and the second bellows 22a, 22b so that the boat table 6 and the supporting boat 5 are isolated from the exterior.

As shown in FIGS. 2A and 2B, pulleys 15a and 15c are provided at the lower end of the first feed screw 13a, and a pulley 15d is provided at the lower end of the second feed screw 13b. A pulley 15b is connected by a belt 16a to the pulley 15a and is also connected to a motor 14. Pulleys 15c and 15d are connected by a belt 16b, and rotation of the motor 14 is thereby transferred to each feed screw. If the diameter of pulley 15c is one half the diameter of pulley 15d, then a vertical traveling speed of the first movable member 12a is twice a traveling speed of the second movable member 12b, so that two bellows can be expanded by about the same amount as shown in FIG. 2B.

In the above example it has been shown that the diameters of two pulleys may be adjusted. Alternatively, the expansion rates of the bellows can be similarly adjusted by changing the screw or thread pitch of each feed screw, or by providing separate motor means for individually rotating each feed screw.

Although the elevation of the movable member has been performed by a feed screw in the two embodiments mentioned above, such elevation may be done by other elevating means, such as an air or oil pressure cylinder instead of the feed screw.

The load lock chamber for a vertical type heat treatment apparatus of the present invention provides means for elevating a boat table supporting objects externally thereof, and the load lock chamber is always maintained in a gastight seal and is not contaminated by particles caused by the elevation.

Moreover, the load lock chamber is made of a flexible member such as a bellows and the elevating means are provided externally thereto, and the volume of the chamber can be reduced thereby.

Furthermore, the sealing flange mounted on the boat table is under atmospheric air conditions, and the boat table, boat and objects, can easily be rotated by accessing a mechanism for rotating the boat table from the exterior thereof.

I claim:

1. A load lock chamber, which is vertically contractible and is arranged below a treatment chamber of a vertical type heat treatment apparatus capable of gas-tightly inserting a means for carrying workpieces therein, comprising:

an upper chamber portion; and a lower chamber portion operatively connected with said upper chamber portion, the size of said lower chamber portion being different from the size of said upper chamber portion, said lower chamber portion being mounted on said means for carrying workpieces;

wherein said load lock chamber is contracted by elevator means provided outside of said load lock chamber and said upper chamber portion operatively connected with said lower chamber portion, in a telescopic relationship formed of a plurality of bellows, by connection means which is movable in a vertical direction by said elevator means.

2. A load lock chamber according to claim 1, wherein said lower chamber portion is defined by a first metal bellows and said upper chamber portion is defined by a second metal bellows, both of said first and second metal bellows are cylindrical in shape and the diameters of which are different from each other.

* * * * *